(12) United States Patent
Bonde et al.

(10) Patent No.: US 11,943,690 B2
(45) Date of Patent: Mar. 26, 2024

(54) SYSTEMS AND METHODS FOR DYNAMIC ADJUSTMENT OF RF AMPLIFIERS

(71) Applicant: Bose Corporation, Framingham, MA (US)

(72) Inventors: Casper Bonde, Stoevring (DK); Kemal Kulovic, Arlington, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 17/653,004

(22) Filed: Mar. 1, 2022

(65) Prior Publication Data

US 2023/0283999 A1 Sep. 7, 2023

(51) Int. Cl.
| | |
|---|---|
| *H04W 4/80* | (2018.01) |
| *H03F 3/189* | (2006.01) |
| *H04B 1/40* | (2015.01) |
| *H04W 24/08* | (2009.01) |
| *H03F 3/20* | (2006.01) |

(52) U.S. Cl.
CPC .............. *H04W 4/80* (2018.02); *H03F 3/189* (2013.01); *H04B 1/40* (2013.01); *H04W 24/08* (2013.01); *H03F 3/20* (2013.01); *H03F 2200/294* (2013.01); *H03F 2200/451* (2013.01)

(58) Field of Classification Search
CPC ......... H04W 4/80; H04W 24/08; H03F 3/189; H03F 3/20; H03F 2200/294; H03F 2200/451; H04B 1/40
USPC ........................................................ 455/41.2
See application file for complete search history.

(56) References Cited

U.S. PATENT DOCUMENTS

| | | | | |
|---|---|---|---|---|
| 8,095,091 | B1 * | 1/2012 | Kopikare | H03G 3/3042 455/127.5 |
| 11,071,064 | B1 | 7/2021 | Wu et al. | |
| 2003/0181184 | A1 * | 9/2003 | Darabi | H04B 1/406 455/253.2 |
| 2010/0216412 | A1 * | 8/2010 | Rofougaran | H04B 1/406 455/78 |
| 2010/0311474 | A1 | 12/2010 | Donovan et al. | |
| 2013/0102267 | A1 * | 4/2013 | Haub | H04B 1/1036 455/296 |
| 2014/0056267 | A1 * | 2/2014 | Li | H04W 52/242 370/329 |

(Continued)

OTHER PUBLICATIONS

The International Search Report and the Written Opinion of the International Searching Authority, PCT Patent Application No. PCT/US2023/014246, dated Jun. 21, 2023, pp. 1-11.

*Primary Examiner* — Eugene Yun
(74) *Attorney, Agent, or Firm* — Bond, Schoeneck & King, PLLC

(57) ABSTRACT

A method for adjusting an RF amplifier is provided. The method includes determining link statistics corresponding to wireless data received by a first device. The wireless data was transmitted by a second device, such as via a Bluetooth protocol. The method further includes adjusting an RF amplifier of the first device or the second device based on the one or more link statistics. The one or more link statistics may include RSSI, PER, buffer level, audio drop data, and acknowledgement packet data. The RF amplifier may be a low noise amplifier or a power amplifier. The adjusting may include increasing or decreasing a gain of the RF amplifier. Alternatively, the adjusting may include activating or deactivating the RF amplifier.

15 Claims, 8 Drawing Sheets

(56) References Cited

U.S. PATENT DOCUMENTS

| | | | |
|---|---|---|---|
| 2014/0254810 A1* | 9/2014 | Abramsky | H04B 5/06 |
| | | | 381/58 |
| 2015/0055733 A1* | 2/2015 | Asano | H04B 1/18 |
| | | | 375/297 |
| 2017/0230907 A1* | 8/2017 | Rose | H03F 3/24 |
| 2020/0187127 A1 | 6/2020 | Mofidi et al. | |
| 2023/0025342 A1* | 1/2023 | Jiang | H04W 52/241 |

\* cited by examiner

SYSTEMS AND METHODS FOR DYNAMIC ADJUSTMENT OF RF AMPLIFIERS

BACKGROUND

Wireless, wearable, Bluetooth-enabled audio devices (such as hearing aids and earbuds) continue to be manufactured in smaller and smaller packages. As a result, optimum antenna placement within these devices becomes more and more challenging. Less than ideal antenna placement can result in reduced link quality between a transmitting device (such as a smartphone) and the receiving audio device. This reduction in link quality is particularly noticeable in the cross-body transmission path, such as from a smartphone in the user's right pocket to the hearing aid in the user's left ear, due to the lossy nature of the human body. While reflections of the transmission off of ceilings and walls can compensate for cross-body transmission losses, these reflections are unavailable if the device is outdoors. Further, any components utilized to improve cross-body transmission are limited by the available power of the battery of the audio device.

SUMMARY

Accordingly, there is a need to improve link quality in challenged conditions while balancing power management for battery-powered devices. For instance, there is a need to improve cross-body transmissions, especially in outdoor environments, while also conserving power stored in battery-powered devices. Thus, the present disclosure provides systems, devices, and methods for dynamically adjusting a radio frequency (RF) amplifier based on link statistics corresponding to wireless transmissions between a first device (such as a hearing aid or earbud) and a second device (such as a smartphone). More specifically, the RF amplifier may be activated, or the gain of the RF amplifier may be increased, if the link statistics indicate the need for improved receiver sensitivity and/or transmission power, such as during outdoor cross-body transmissions. The RF amplifier may be arranged in the first device to improve receiver sensitivity, or in the second device to increase transmission power. Further, triggering the adjustment of the RF amplifier based on the link statistics limits the power consumption of the RF amplifier to periods when increased receiver sensitivity or transmission power is required, thus conserving battery power when increased receiver sensitivity or transmission power is unnecessary.

In some examples, the link statistics include received signal strength indicator (RSSI), packet error ratio (PER), buffer level, audio drop data, and acknowledgement packet data. A processor of the first device or the second device may evaluate the link statistics and adjust the RF amplifier accordingly. The RF amplifier may be adjusted based on one of or a combination of these link statistics.

In some examples, the RF amplifier is a low noise amplifier (LNA) of the first device. Activating or increasing the gain of the LNA of the first device improves receiver sensitivity, thereby improving link quality when signal strength is low. The wireless data received by the first device is transmitted by the second device and may include audio data to be played back by an acoustic transducer of the first device. The wireless data may also include any other type of data, depending on the particular application.

In some examples, the RF amplifier is a power amplifier (PA) of the second device. Activating or increasing the gain of the PA of the second device increases the transmission power of wireless data transmitted by the second device, thereby improving signal strength at the first device. The wireless data transmitted by the second device may include audio data to be played back by an acoustic transducer of the first device. The wireless data may also include any other type of data, depending on the particular application.

In some examples, the RF amplifier is a PA of the first device. Activating or increasing the gain of the PA of the first device increases the transmission power of the wireless data transmitted by the first device back to the second device. The wireless data transmitted by the first device may include acknowledgment data regarding the reception of the wireless data initially transmitted by the second device.

In some examples, adjusting the RF amplifier may be further based on predetermined patterns determined by the processor. The predetermined patterns may correspond to a specific user activity, such as walking, cycling, or running. By determining the user is performing an outdoor activity (such as walking), the processor can activate or increase the gain of the RF amplifier to improve cross-body performance in the outdoor environment. The periodic pattern can be determined based on sensor data captured by one or more sensors on the first device and/or the second device, such as motion sensors or audio sensors. In further examples, the periodic pattern can also be determined based on the link statistics by using pattern detection. In even further examples, the processor may be configured to use both the periodic pattern and link statistics to adjust the RF amplifier using artificial intelligence, machine learning, and/or other algorithms and processes.

In some examples, the RF amplifier is arranged in a front-end module. The front-end module can include a bypass circuit. The front-end module is configured to receive a control signal from the processor. The control signal corresponds to the link statistics. The control signal configures the front-end module to bypass and/or deactivate the RF amplifier when the link statistics indicate sufficient wireless transmission between the second device and the first device. The control signal may then activate the RF amplifier when improved receiver sensitivity or increased transmission power is required. In further examples, the control signal may increase or decrease the gain of the RF amplifier.

In some examples, the wireless transmissions are transmitted via Bluetooth protocols, such as Bluetooth Classic, Bluetooth Low Energy (BLE), Bluetooth LE Asynchronous Connection-Less (ACL), or LE Audio. For example, the first device may be a hearing aid receiving wireless data transmitted by the second device embodied as a smartphone. The smartphone and the hearing aid may form an LE Audio connection, such as a Connected Isochronous Stream (CIS). In these examples, the hearing aid includes a Bluetooth transceiver configured to evaluate the LE Audio connection according to the aforementioned link statistics. Further, the processor may be configured to improve transmission power through selection of Bluetooth physical layers. For example, the processor may select a 1-Megabit per second layer, a 2-Megabits per second layer, and/or a coded layer based on the link statistics.

Generally, in one aspect, a method for adjusting an RF amplifier of a first device or a second device is provided. The method includes determining one or more link statistics. The link statistics correspond to wireless data. The wireless data is transmitted by a second device and received by a first device. According to an example, the wireless data is transmitted via a Bluetooth protocol.

The method further includes adjusting the RF amplifier. The adjusting is based on the one or more link statistics. According to an example, the one or more link statistics include at least one of received signal strength indicator (RSSI), packet error ratio (PER), buffer level, audio drop data, and acknowledgement packet data.

According to an example, the RF amplifier is a low noise amplifier. According to another example, the RF amplifier is a power amplifier.

According to an example, the adjusting is further based on a periodic pattern. The periodic pattern may be based on the one or more link statistics or sensor data captured by one or more sensors. Further to this example, the sensor data may include motion data and/or audio data.

According to an example, the adjusting includes increasing or decreasing a gain of the RF amplifier. Alternatively, the adjusting may include activating or deactivating the RF amplifier.

Generally, in another example, a first device is provided. The first device includes a wireless transceiver. The wireless transceiver is configured to receive wireless data transmitted by a second device. The wireless transceiver may be a Bluetooth transceiver.

The first device further includes a processor. The processor is configured to determine one or more link statistics. The one or more link statistics correspond to the wireless data transmitted by the second device and received by the first device. According to an example, the one or more link statistics include at least one of RSSI, PER, buffer level, audio drop data, and acknowledgement packet data.

The processor is further configured to adjust an RF amplifier of the first device or the second device. The adjusting is based on the one or more link statistics. According to an example, the RF amplifier is a low noise amplifier or a power amplifier.

According to an example, a front-end module embedded in the first device includes the RF amplifier. Further to this example, the front-end module may be configured to bypass the RF amplifier based on the one or more link statistics.

According to an example, the processor is further configured to select one of a plurality of Bluetooth physical layers based on the one or more link statistics. The plurality of physical layers may include a 1-Megabit per second layer, a 2-Megabits per second layer, and/or a coded layer.

According to an example, the first device further includes an acoustic transducer. The acoustic transducer is configured to generate audio based on the wireless data.

According to an example, the first device further includes one or more sensors. The one or more sensors are configured to capture sensor data. Further to this example, the processor is further configured to adjust the RF amplifier based on a periodic pattern, wherein the periodic pattern is based on the sensor data or the one or more link statistics.

In various implementations, a processor or controller can be associated with one or more storage media (generically referred to herein as "memory," e.g., volatile and non-volatile computer memory such as ROM, RAM, PROM, EPROM, and EEPROM, floppy disks, compact disks, optical disks, magnetic tape, Flash, OTP-ROM, SSD, HDD, etc.). In some implementations, the storage media can be encoded with one or more programs that, when executed on one or more processors and/or controllers, perform at least some of the functions discussed herein. Various storage media can be fixed within a processor or controller or can be transportable, such that the one or more programs stored thereon can be loaded into a processor or controller so as to implement various aspects as discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also can appear in any disclosure incorporated by reference should be accorded a meaning most consistent with the particular concepts disclosed herein.

Other features and advantages will be apparent from the description and the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various examples.

DETAILED DESCRIPTION

The present disclosure provides systems, devices, and methods for dynamically adjusting a radio frequency (RF) amplifier based on link statistics corresponding to wireless transmissions between a first device (such as a hearing aid or earbud) and a second device (such as a smartphone). More specifically, the RF amplifier may be adjusted if the link statistics indicate the need for improved receiver sensitivity and/or transmission power, such as during outdoor cross-body transmissions. The RF amplifier may be arranged in the first device to improve receiver sensitivity, or in the second device to increase transmission power. Further, triggering the adjustment of the RF amplifier based on the link statistics limits the power consumption of the RF amplifier to periods when increased receiver sensitivity or transmission power is required.

Figure 1:
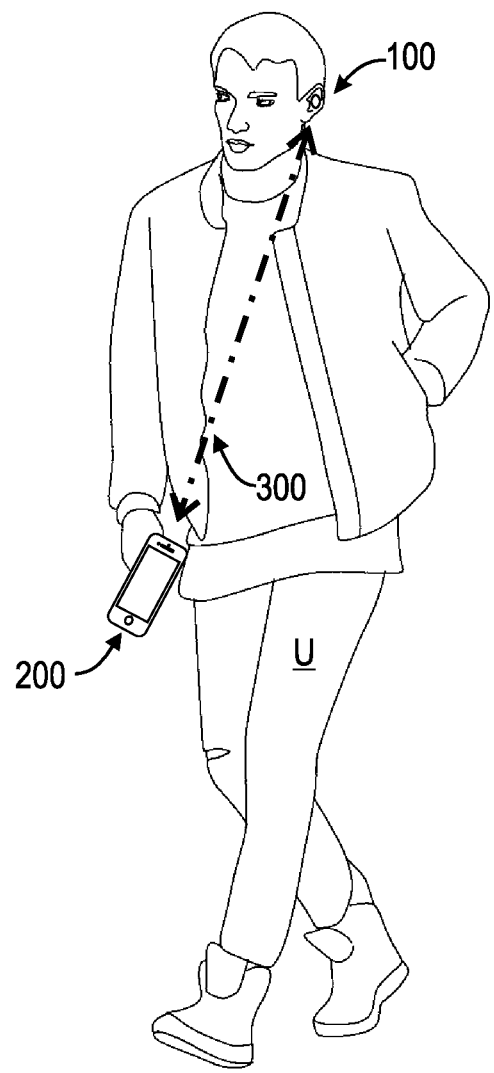
FIG. 1 is an illustration of a cross-body transmission path, according to an example.

FIG. 1 shows a user U wearing a first device 100, embodied by an audio device, such as a hearing aid, in their left ear. The user U is also holding a second device 200, embodied by a smartphone, in their right hand near their right hip. Accordingly, the most direct wireless communication path between the first device 100 and the second device 200 is a cross-body transmission path 300, as illustrated in FIG. 1. In this example, wireless data 106 (see FIGS. 2-5) can be transmitted along the cross-body transmission path 300 in a bidirectional manner. For instance, the first device 100 may receive audio data transmitted by the second device 200. This audio data may then be played back by an acoustic transducer 130 (see FIG. 5) of the first device 100. The second device 200 may also transmit other types of data to the first device 100, such as data to configure the software or firmware of the first device 100. Similarly, the second device 200 may receive acknowledgement packets from the first device 100 acknowledging the reception of previously transmitted data. Further, the second device 200 may receive data describing the first device 100, such as data regarding battery life, audio settings, performance, etc. Even further, the second device 200 may also receive data captured by the first device 100, such as audio captured by one or more microphones. However, as described above, the cross-body transmission path 300 may experience losses due to the lossy impact of the human body on RF transmissions. In indoor situations, reflections off of walls and ceilings can compensate for losses in the cross-body transmission path 300. However, in outdoor situations, these reflections are unavailable. Accordingly, additional steps must be taken to compensate for the losses in the cross-body transmission path 300. In one example, the wireless data 106 is transmitted over the cross-body transmission path 300 via a Bluetooth protocol, such as Bluetooth Classic, Bluetooth Low Energy (BLE), Bluetooth LE Asynchronous Connection-Less (ACL), or LE Audio. In the example of LE Audio, the second device 200 and the first device 100 may form an LE Audio connection, such as a Connected Isochronous Stream (CIS).

Figure 2:
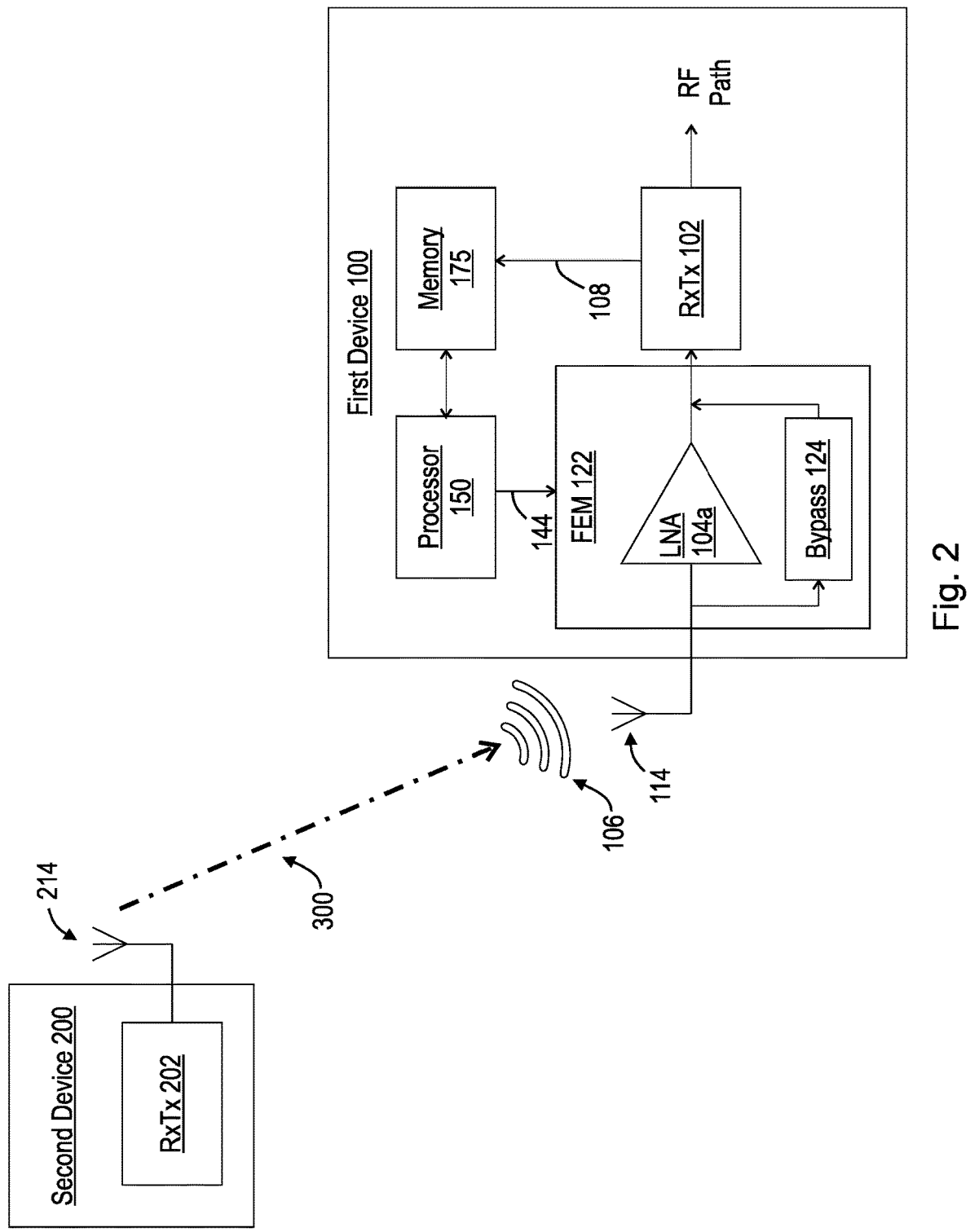
FIG. 2 is a schematic of a first device with an adjustable low noise amplifier in communication with a second device, according to an example.

FIG. 2 illustrates a schematic of a first device 100 in communication with a second device 200. The schematic representation of the first device 100 and the second device 200 in the foregoing figures are solely for explanatory purposes and omits certain aspects of each device 100, 200 for clarity. The second device 200 is configured to transmit wireless data 106 via wireless transceiver 202 and antenna 214. The second device 200 may be any type of device capable of transmitting wireless data 106, such as a smartphone. The wireless data 106 transmitted by the second device 200 travels over the cross-body transmission path 300, as shown in FIG. 1, and is received by an antenna 114 of the first device 100. The first device 100 may be any type of device capable of receiving wireless data 106, such as a hearing aid, earbud, audio headset, audio eyeglasses, portable loudspeaker, etc. While the aforementioned first devices 100 include one or more audio components, in some examples the first device 100 is not necessarily an audio device. Further, while the wireless data 106 transmitted by the second device 200 may include audio data, the wireless data 106 does not necessarily need to include audio data. Indeed, the wireless data 106 may contain other types of data, such as data to control or configure aspects of the first device 100.

As shown in FIG. 2, the first device 100 includes a wireless transceiver 102, antenna 114, memory 175, processor 150, and front-end module (FEM) 122. The wireless transceiver 102 receives the wireless data 106 via the antenna 114 and the FEM 122. The wireless transceiver 102 may be a smart Bluetooth transceiver. The wireless transceiver 102 is configured to determine a number of link statistics 108 corresponding to the transmission of the wireless data 106. The link statistics 108 describe a number of important properties of the transmission used to evaluate whether compensation is required to offset losses in the cross-body transmission path 300. In some examples, the wireless transceiver 102 may be divided into discrete transmitter and receiver components, each component corresponding to a unique antenna.

The link statistics 108 may include a received signal strength indicator (RSSI) 110, packet error ratio (PER) 112, buffer level 116, audio drop data 118, and acknowledgement packet data 120. RSSI 110 is an estimate measure of power level of the wireless signal carrying the wireless data 106 received by the first device 100. PER 112 is the ratio of incorrectly received data packets to the total number of received packets. Buffer level 116 indicates the amount of data temporarily stored in a buffer during transmission or reception. Audio drop data 118 indicates drops in audio data when the first device 100 is an audio device. Acknowledgement packet data 120 indicates whether acknowledgements of received wireless data 106 were received. In one example, the first device 100 transmits acknowledgement packets to the second device 200 to confirm receipt of the wireless data 106. Other types of link statistics 106 may also be evaluated depending on the application.

Once generated by the wireless transceiver 102, the link statistics 108 are stored in memory 175 for retrieval by the processor 150. The processor 150 then analyzes the link statistics 108 to determine if the cross-body transmission path 300 requires compensation. Any combination of types of link statistics 108 and thresholds may be used. For instance, if the RSSI 110 decreases below a certain absolute threshold, compensation may be required. Further, if the current RSSI 110 measurement decreased a certain amount relative to the previous RSSI 110 measurement, compensation may be required. Even further, if the PER 112 decreases below a certain threshold, while, concurrently, the audio drop data 120 indicates one or more audio drops in a certain period, compensation may be required. These determinations may be made according to a wide variety of algorithms, which may be optimized using certain analysis techniques, such as machine learning.

Based on the analysis of the link statistics 108, the processor 150 generates a control signal 144. As shown in FIG. 2, the control signal 144 is provided to the FEM 122. The FEM 122 of FIG. 2 includes an RF amplifier 104 of the first device 100, embodied as a low noise amplifier (LNA) 104a. The FEM 122 also includes bypass circuitry 124 forming a signal path circumventing the LNA 104a. The bypass circuitry 124 may include one or more switching elements, such as discrete switches, transistors, diodes, etc. to selectively activate or deactivate the signal path circumventing the LNA 104a. In one example, the control signal 144 places the FEM 122 in active mode, which activates the LNA 104a and deactivates the bypass circuitry 124. Alternatively, the control signal 144 may place the FEM 122 in sleep mode, which deactivates the LNA 104a and activates the bypass circuitry 124. Notably, the power consumption of the FEM 122 in sleep mode is significantly lower than in active mode.

Low noise amplifiers are generally used to amplify the power of received wireless signals, while limiting the amount of noise introduced during the amplification, thus improving the receiver sensitivity. However, this improved receiver sensitivity comes at the expense of increased power usage by the low noise amplifier. Compact wireless devices, such as earbuds and hearing aids, typically have very small batteries with low power capacity, thus making power conservation critical to the operation of the wireless device.

The first device 100 of FIG. 2 addresses this concern by using the processor 150 to selectively control the LNA 104a of the FEM 122 based on the link statistics 108. For example, if the processor 150 determines, based on the link statistics 108, that increased receiver sensitivity is required due to losses in the cross-body transmission path 300, the control signal 144 places the FEM 122 in active mode, which activates the LNA 104a, and deactivates the bypass circuitry 134. Alternatively, if the processor 150 determines that increased receiver sensitivity is no longer required, the control signal 144 places the FEM 122 into sleep mode, thus deactivating the LNA 104a, and activating the bypass circuitry 134. In this way, the processor 150 conserves power and battery life by only activating the FEM 122 when increased receiver sensitivity is required. In some examples, the processor 150 may also generate the control signal 144 to increase or decrease the gain of the LNA 104a based on the link statistics 108.

In some examples, the processor 150 controls the LNA 104a directly, without a FEM 122. In these examples, the first device 100 may also have bypass circuitry 124 selectively controlled by the processor 150. In these examples, the LNA 104a and/or the bypass circuitry 124 may receive the control signal 144 directly from the processor 150.

Figure 3:
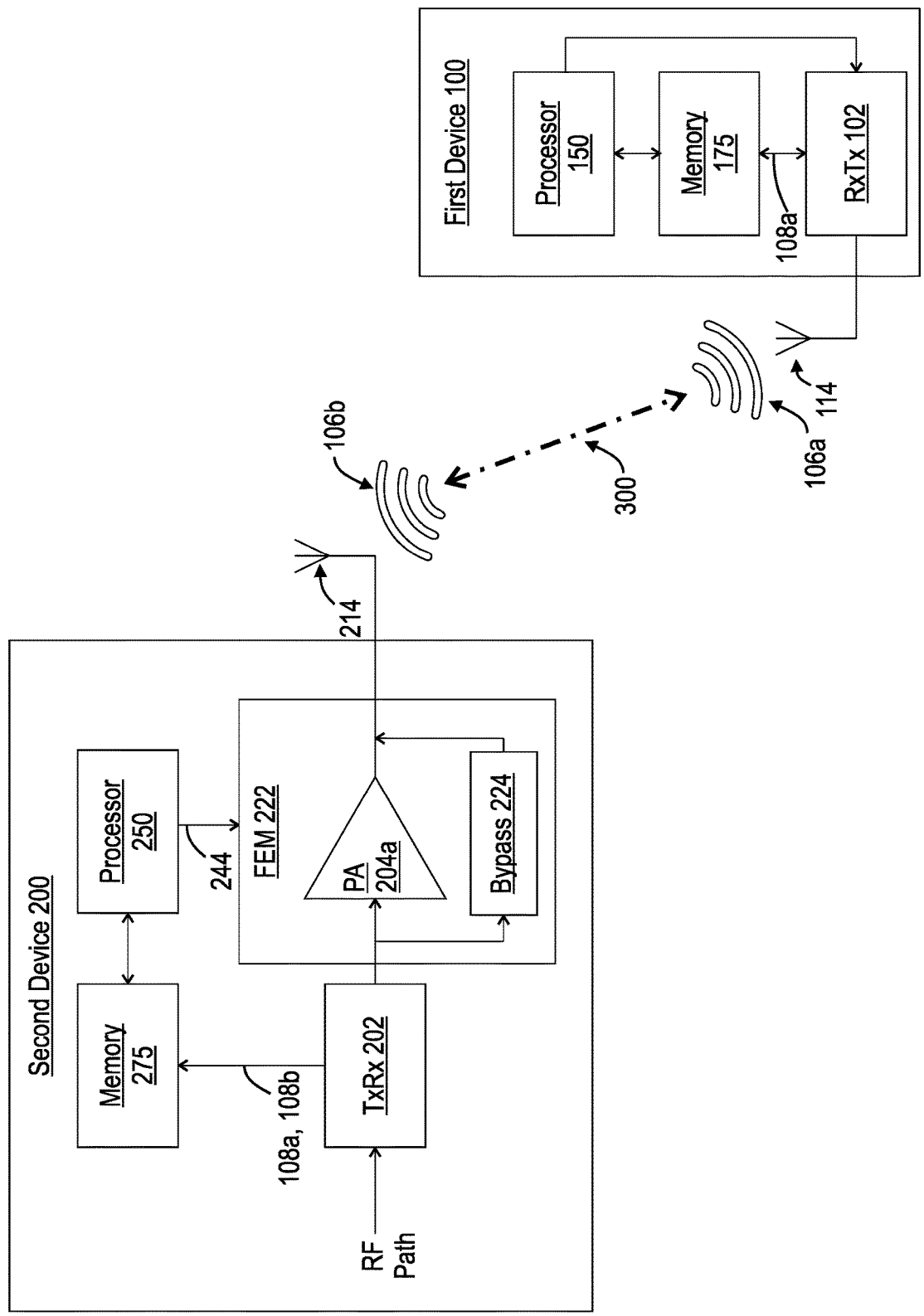
FIG. 3 is a schematic of a second device with an adjustable power amplifier in communication with a first device, according to an example.

A variation of the arrangement of FIG. 2 is shown in FIG. 3 directed to selectively increase the transmission power of the second device 200, rather than increasing the receiver sensitivity of the first device 100. In FIG. 3, as with FIG. 2, the wireless transceiver 202 of the second device 200 transmits, via antenna 214 and FEM 222, wireless data 106a across the cross-body transmission path 300. The wireless data 106a is received by the wireless transceiver 102, via antenna 114, of the first device 100. The first device 100 then responds by transmitting wireless data 106b back to the second device 200 via the cross-body transmission path 300.

Similar to the first device 100 depicted in FIG. 2, the second device 200 of FIG. 3, includes the wireless transceiver 202, antenna 214, memory 275, processor 250, and FEM 222 with an RF amplifier 204 and bypass circuitry 224. However, rather than an LNA, the RF amplifier 204 is embodied as a power amplifier (PA). Power amplifiers are generally used to significantly amplify an RF signal immediately before transmission. Like the LNA 104a of FIG. 2, the processor 250 is configured to provide a control signal 244 to the FEM 222. The processor 250 uses the control signal 244 to selectively place the FEM 222 in active mode (activating PA 204a and deactivating bypass 224) when increased transmission power is required to compensate for losses in the cross-body transmission path 300. Similarly, the processor 250 is configured to place the FEM 222 in sleep mode (deactivating PA 204a and activating bypass 224) to conserve power and battery life when increase transmission power is not required.

As with FIG. 2, whether an increase in transmission power is required is determined based on link statistics 108a, 108b. In one example, and as described with respect to FIG. 2, the link statistics 108a are determined by the wireless transceiver 102 of the first device 100, and transmitted to the second device 200 with wireless data 106b. These link statistics 108a are then received by the wireless transceiver 202, and stored in memory 275 for retrieval by the processor 250 for analysis. Link statistics 108b may also be determined by the wireless transceiver 202 of the second device 200. For example, these link statistics 108b may include acknowledgement packet data 120 based on the wireless transceiver 202 of the second device 200 receiving (or not receiving) acknowledgement packets transmitted by the wireless transceiver 102 of the first device 100. These link statistics 108b are also stored in the memory 275 for retrieval by the processor 250 for analysis.

The processor 250 analyzes a combination of one or more link statistics 108a, 108b to generate the control signal 244. In this way, the control signal 244 communicates to the FEM 222 whether or not increased transmission power is required. The processor 250 may use different combinations of types of link statistics 108a, 108b and/or corresponding thresholds than the first device 100 uses to generate the control signal 144. In some situations, rather than simply activating or deactivating PA 204a and bypass circuitry 224, the control signal 144 may increase or decrease the gain of the PA 204a.

Figure 4:
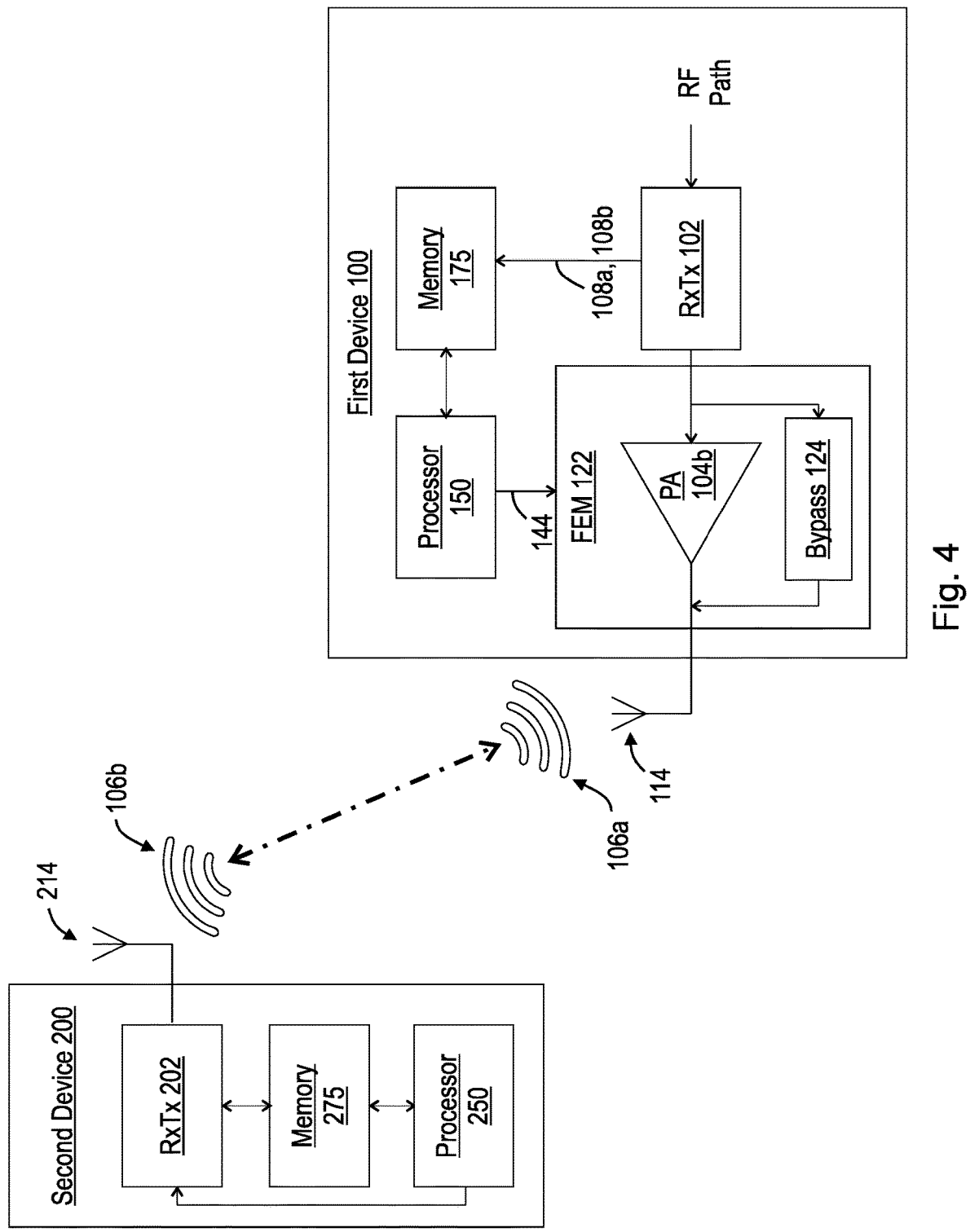
FIG. 4 is a schematic of a first device with an adjustable power amplifier in communication with a second device, according to an example.

A variation of the arrangements of FIGS. 2 and 3 is shown in FIG. 4 directed to selectively increase the transmission power of the first device 100. In this example, wireless transceiver 102 transmits, via antenna 114, wireless data 106b to second device 200. As described above, this wireless data 106b may include acknowledgement packets and/or other information regarding or captured by the first device 100. The acknowledgement packets show the second device 200 that the wireless data 106a transmitted by the second device 200 were successfully received by the first device 100. However, if losses in the cross-body transmission path 300 prevent the second device 200 from receiving the wireless data 106b including the acknowledgement packets, the second device 200 responds as if the first device 100 never received the initially transmitted wireless data 106a. Accordingly, the second device 200 may then unnecessarily retransmit portions of the wireless data 106a, consuming extra power and delaying the transmission of other data. However, this situation may be avoided by using a PA 104b of the first device 100 to increase the transmission power of the signal carrying wireless data 106b.

In the example of FIG. 4, and as in FIG. 3, link statistics 108a may be generated by the wireless transceiver 102 of the first device 100, and link statistics 108b may be generated by the wireless transceiver 202 of the second device 200. The link statistics 108b may be transmitted to the first device 100 with wireless data 106a. The processor 150 evaluates the link statistics 108a, 108b to determine if increased transmission power (to transmit wireless data 106b) is required. If so, the control signal 144 generated by the processor 150 selectively places the FEM 122 into active mode (activating PA 104b and deactivating bypass circuitry 124) to increase transmission power to compensate for losses in the cross-body transmission path 300. If not, the control signal 144 places the FEM 122 into sleep mode (deactivating PA 104b and activating bypass circuitry 124) to conserve power and battery life when increase transmission power is not required.

In some examples, activating the PA 104b may actually lead to an overall reduction in power consumption. As described above, lost acknowledgment packets may cause the second device 200 to unnecessarily retransmit portions of the previously transmitted wireless data 106a. Retransmitting data and duplicative reception and processing consumes additional power. By successfully transmitting the acknowledgement packets to the second device 200, this retransmission and processing is avoided.

In some examples, the first device 100 includes both a selectively controllable LNA 104a (as shown in FIG. 2) and a selectively controllable PA 104b. The LNA 104a and PA 104b may be arranged in the same FEM 122, or they may be arranged in discrete FEMs 122. In further examples, either or both of the LNA 104a and PA 104b may be arranged within the transceiver 102.

Figure 5:
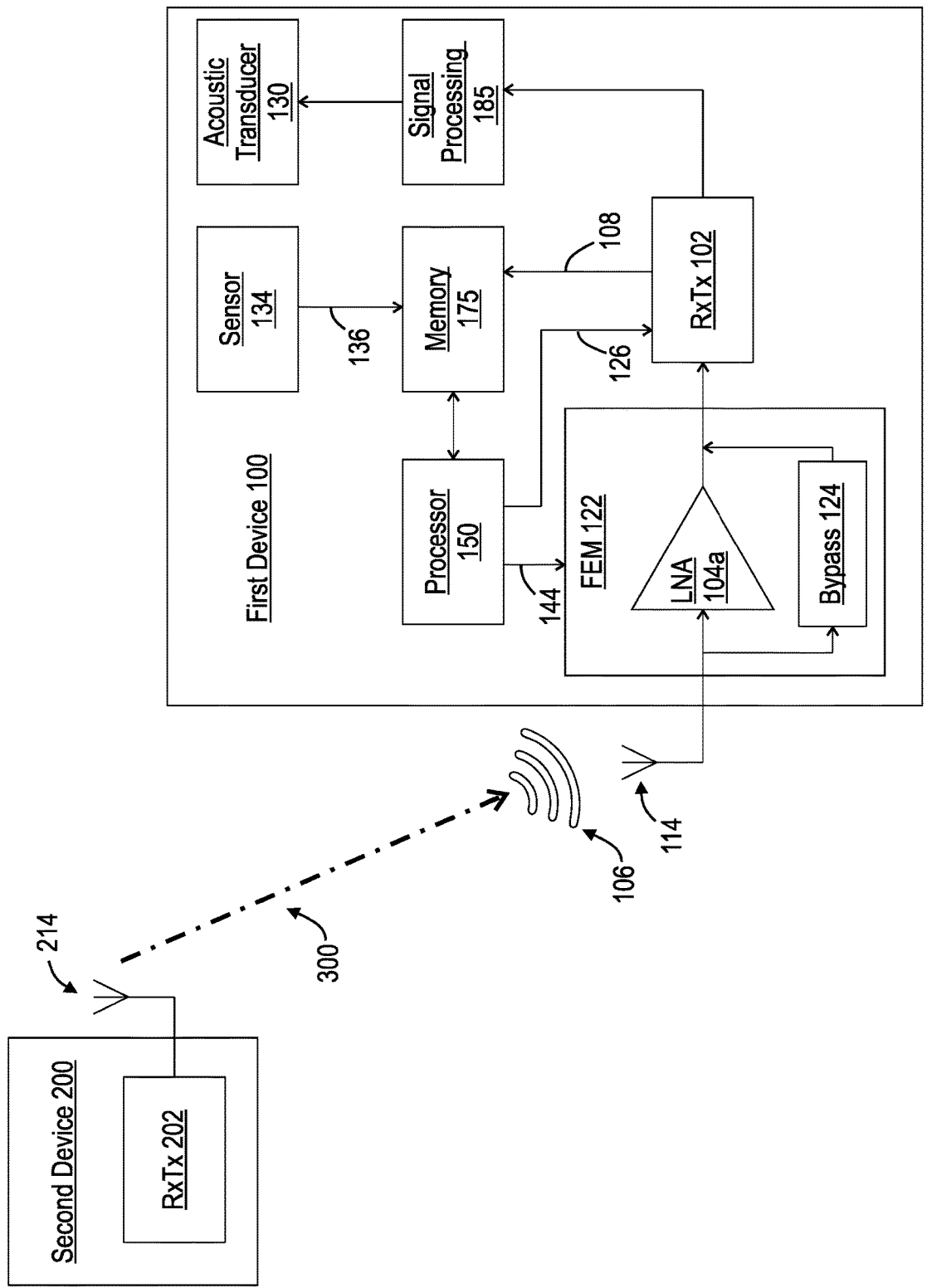
FIG. 5 is a schematic of a first device with an adjustable low noise amplifier, a sensor, and an acoustic transducer, in communication with a second device, according to an example.

FIG. 5 depicts a further variation of the arrangement of FIG. 2. In FIG. 2, the first device 100 further includes a sensor 134. In some examples, the sensor 134 may be a motion sensor or an audio sensor. Other types of sensors may be used depending on the application. The sensor 134 captures sensor data 136, and stores the sensor data 136 in the memory 175. The processor 150 then retrieves the sensor data 136 from memory 175 and analyzes the sensor data 136 to determine one or more periodic patterns 138. These periodic patterns 138 may be used to indicate outdoor user behavior, such as walking, running, or cycling. For instance, patterns in the motion data may indicate these certain types of movements. In further examples, these movements may also be determined based on the link statistics 108. In another example, audio data corresponding to wind sounds may be indicative of outdoor behavior. The processor 150 may then use this sensor data 136, either alone or in combination with the link statistics 108, to generate the control signal 144 to activate or deactivate the LNA 104a. The periodic patterns 138 may be determined using machine learning, artificial intelligence, or other algorithms and/or processes.

Further, if the wireless transceiver 102 is a Bluetooth transceiver, the processor 150 may be configured to select one of a plurality of Bluetooth physical layers (PHY) 126 based on the link statistics. The plurality of PHY layers 126 may include a 1-Megabit per second layer (1 Mb layer) 128, a 2-Megabits per second layer (2 Mb layer) 140, and a coded layer 142. Generally, transmission using the 2 MB layer 140 are less robust than the 1 Mb layer, and transmissions using the 1 Mb layer 140 are less robust than the coded layer 142. However, robustness roughly correlates to power consumption, such that using the coded layer 142 may consume more power than using the 1 Mb layer 140, and using the 1 Mb layer 140 may consume more than the 2 Mb layer 128. Thus, in an analogous manner to the selectable RF amplifier 104, the processor 150 may configure the wireless transceiver 102 to use the coded layer 142 or 1 Mb layer 140 when increased robustness over the cross-body transmission path 300 is required, and to then use the 2 Mb layer 142 when increased robustness is not required. Modifying the chosen PHY layer 126 may also correspond to activating or deactivating the RF amplifier 104.

Further, the first device 100 may further include an acoustic transducer 130. The acoustic transducer 130 may be configured to generate audio 132 based on at least a portion of the wireless data 106 received by the first device 100. As shown in FIG. 5, the wireless transceiver 102 is configured to receive the output of the FEM 122. The acoustic transducer 130 is electrically coupled to the wireless transceiver 102 via signal processing circuitry 185. The signal processing circuitry 185 may include a combination of components (such as filters, switches, mixers, etc.) to process the output from the wireless transceiver 102 into an input audio signal of which the acoustic transducer 130 may translate into audio 132.

Figure 6:
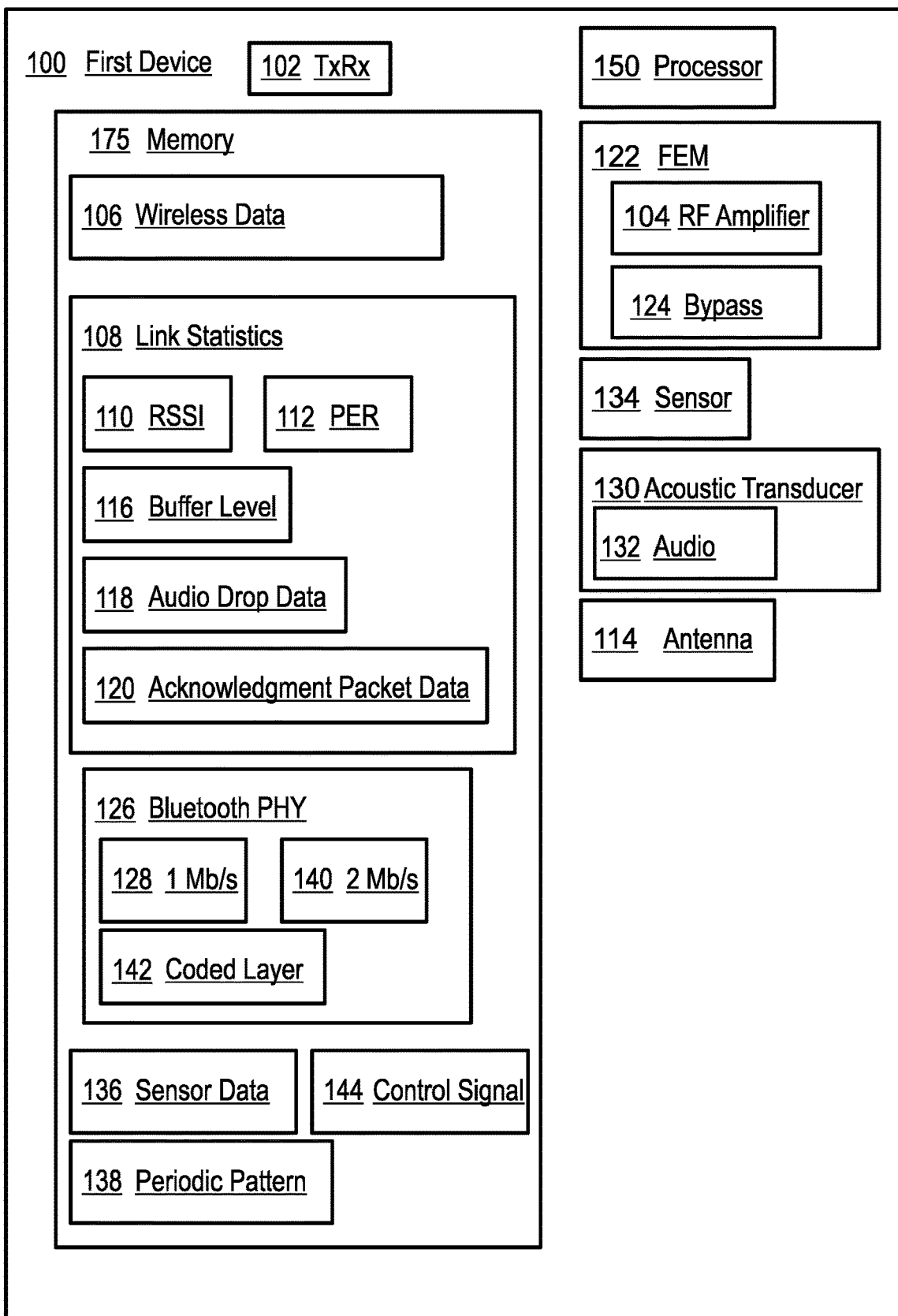
FIG. 6 is a schematic of a first device, according to an example.

FIG. 6 illustrates a more detailed schematic of the first device 100. In FIG. 6, the first device 100 includes the wireless transceiver 102, antenna 114, processor 150, memory 175, FEM 122, sensor 134, and acoustic transducer 130. The FEM 122 includes the RF amplifier 104 and the bypass circuitry 124. The acoustic transducer 130 generates audio 132. The memory stores wireless data 106, link statistics 108, sensor data 136, periodic patterns 138 corresponding to the sensor data 136, data related to the control signal 144, and data related to the Bluetooth PHY 126.

Figure 7:
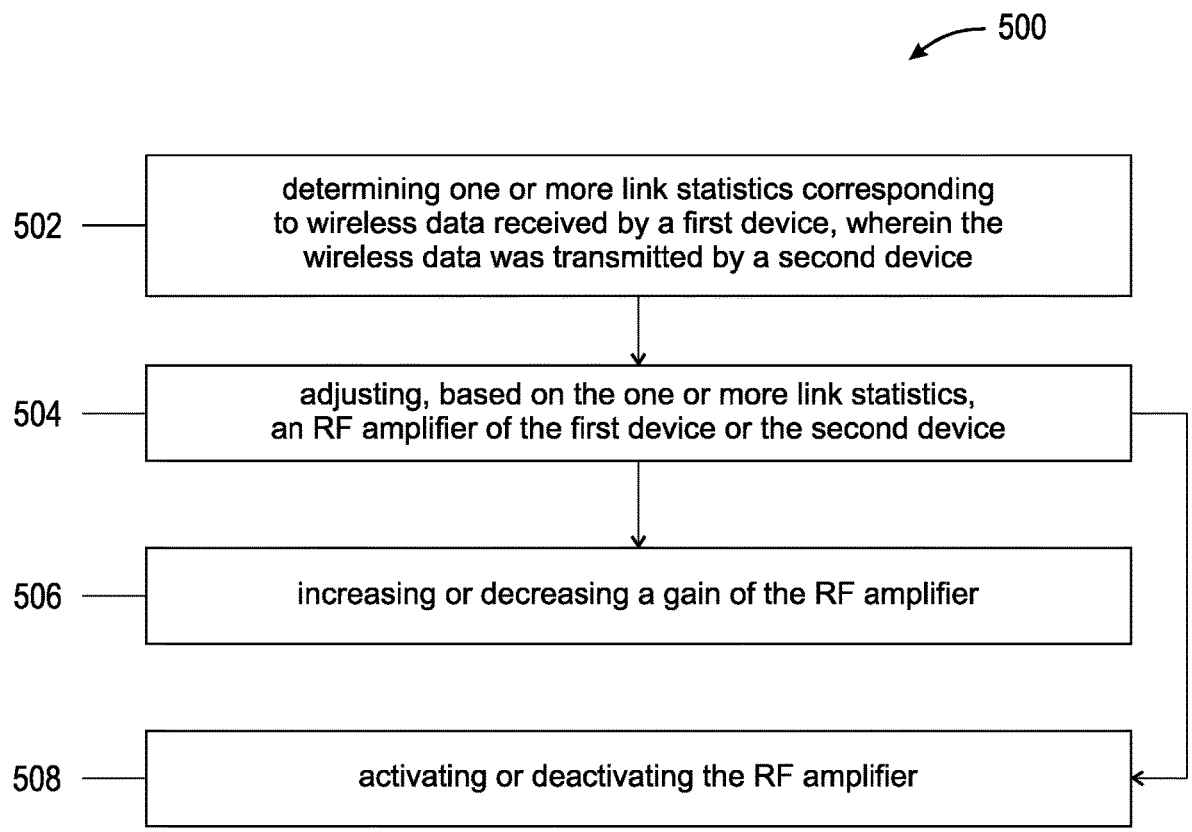
FIG. 7 is a flowchart of a method for dynamically adjusting a radio frequency (RF) amplifier, according to an example.

FIG. 7 is a flowchart of a method 500 for dynamically adjusting an RF amplifier. The method 500 includes determining 502 one or more link statistics. The link statistics correspond to wireless data. The wireless data is transmitted by a second device and received by a first device.

The method 500 further includes adjusting an RF amplifier of the first device or the second device. The adjusting is based on the one or more link statistics.

According to an example, the adjusting includes increasing or decreasing 506 a gain of the RF amplifier. Alternatively, the adjusting may include activating or deactivating 508 the RF amplifier.

Figure 8:
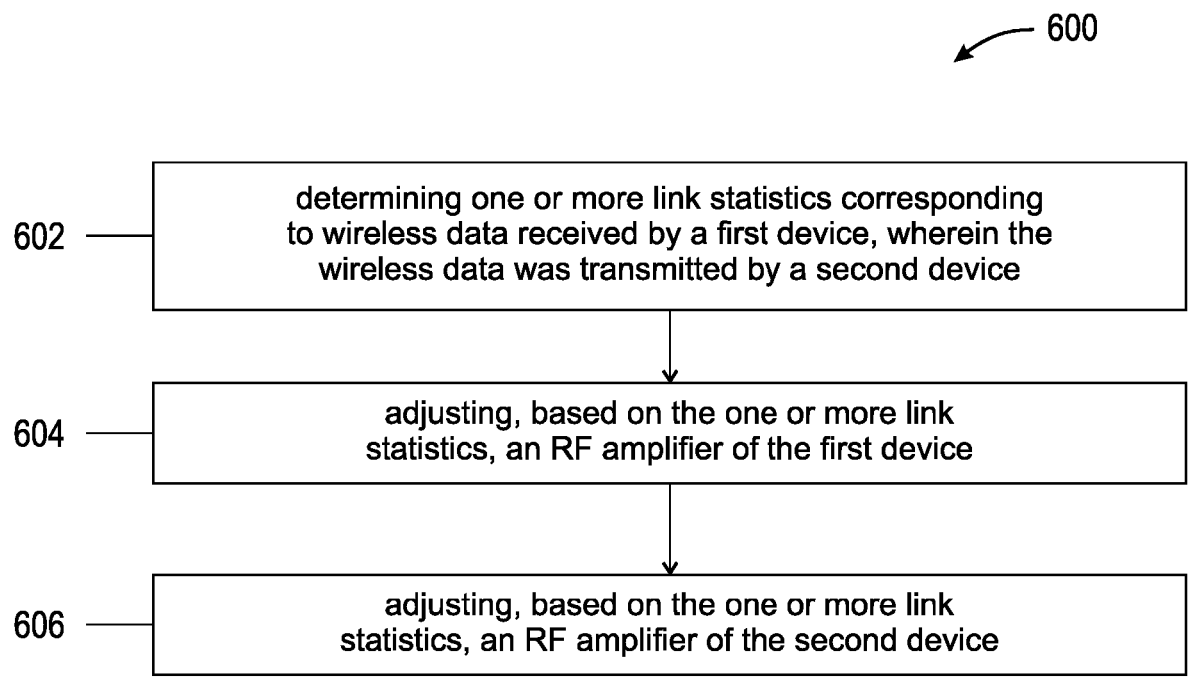
FIG. 8 is a flowchart of a method for dynamically adjusting two or more RF amplifiers, according to an example.

FIG. 8 is a variation of FIG. 7. FIG. 8 is a flowchart of a method 600 for dynamically adjusting two or more RF amplifiers. The method 600 includes determining 602 one or more link statistics. The link statistics correspond to wireless data. The wireless data is transmitted by a second device and received by a first device.

The method 600 further includes adjusting 604 an RF amplifier of the first device. The adjusting is based on the one or more link statistics. In this example, the first device may be a hearing aid or an earbud. The RF amplifier of the first device may be a LNA or a PA The method 600 further includes adjusting 606 an RF amplifier of the second device. The adjusting is based on the one or more link statistics. In this example, the first device may be a hearing aid or an earbud. The RF amplifier of the second device may be a PA.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects can be implemented using hardware, software or a combination thereof. When any aspect is implemented at least in part in software, the software code can be executed on any suitable processor or collection of processors, whether provided in a single device or computer or distributed among multiple devices/computers.

The present disclosure can be implemented as a system, a method, and/or a computer program product at any possible technical detail level of integration. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some examples, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer readable program instructions.

The computer readable program instructions can be provided to a processor of a, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant can be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific examples described herein. It is, therefore, to be understood that the foregoing examples are presented by way of example only and that, within the scope of the appended claims and equivalents thereto, examples can be practiced otherwise than as specifically described and claimed. Examples of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A method comprising:
    determining one or more link statistics corresponding to wireless data received by a wearable audio device, wherein the wireless data was transmitted by a portable computing device, and wherein the one or more link statistics comprise at least one of packet error ratio (PER), buffer level, audio drop data, and acknowledgement packet data;
    determining a periodic pattern based on sensor data captured by one or more sensors of the wearable audio device; and
    adjusting, based on the one or more link statistics and the periodic pattern, a radio frequency (RF) amplifier of a transmission path of the portable computing device;
    wherein a front-end module embedded in the portable computing device comprises the RF amplifier, and
    wherein the front-end module is configured to bypass the RF amplifier based on the one or more link statistics.

2. The method of claim 1, wherein the wireless data is transmitted via a Bluetooth protocol.

3. The method of claim 1, wherein the RF amplifier is a low noise amplifier.

4. The method of claim 1, wherein the RF amplifier is a power amplifier.

5. The method of claim 1, wherein the sensor data comprises motion data and/or audio data.

6. The method of claim 1, wherein the adjusting comprises increasing or decreasing a gain of the RF amplifier.

7. The method of claim 1, wherein the adjusting comprises activating or deactivating the RF amplifier.

8. The method of claim 1, wherein the periodic pattern is indicative of outdoor user activity.

9. A wearable audio device, comprising:
    a wireless transceiver configured to receive wireless data transmitted by a portable computing device; and
    a processor configured to:
        determine one or more link statistics corresponding to the wireless data transmitted by the portable computing device and received by the wearable audio device, wherein the one or more link statistics comprise at least one of packet error ratio (PER), buffer level, audio drop data, and acknowledgement packet data;
        determine a periodic pattern based on sensor data captured by one or more sensors of the wearable audio device; and
        adjust, based on the one or more link statistics and the periodic pattern, a radio frequency (RF) amplifier of a transmission path of the portable computing device;
    wherein a front-end module embedded in the portable computing device comprises the RF amplifier, and
    wherein the front-end module is configured to bypass the RF amplifier based on the one or more link statistics.

10. The wearable audio device of claim 9, wherein the RF amplifier is a low noise amplifier or a power amplifier.

11. The wearable audio device of claim 9, wherein the wireless transceiver is a Bluetooth transceiver.

12. The wearable audio device of claim 11, wherein the processor is further configured to select one of a plurality of Bluetooth physical layers based on the one or more link statistics.

13. The wearable audio device of claim 12, wherein the plurality of physical layers comprise a 1-Megabit per second layer, a 2-Megabits per second layer, and/or a coded layer.

14. The wearable audio device of claim 9, further comprising an acoustic transducer configured to generate audio based on the wireless data.

15. The wearable audio device of claim 9, wherein the periodic pattern is indicative of outdoor user activity.

* * * * *